(12) United States Patent
Oh et al.

(10) Patent No.: US 10,141,210 B2
(45) Date of Patent: Nov. 27, 2018

(54) PURGE MODULE AND LOAD PORT HAVING THE SAME

(71) Applicant: RORZE SYSTEMS CORPORATION, Yongin-si, Gyeonggi-do (KR)

(72) Inventors: Seung Bae Oh, Yongin-si (KR); Tae Young Eom, Seongnam-si (KR); Masahiko Uchiyama, Yongin-si (KR)

(73) Assignee: RORZE SYSTEMS CORPORATION, Yongin-si, Gyeonggi-Do (KR)

(*) Notice: Subject to any disclaimer, the term of this patent is extended or adjusted under 35 U.S.C. 154(b) by 0 days.

(21) Appl. No.: 15/121,481

(22) PCT Filed: Aug. 24, 2015

(86) PCT No.: PCT/KR2015/008796
§ 371 (c)(1),
(2) Date: Aug. 25, 2016

(87) PCT Pub. No.: WO2016/036039
PCT Pub. Date: Mar. 10, 2016

(65) Prior Publication Data
US 2017/0170043 A1    Jun. 15, 2017

(30) Foreign Application Priority Data
Sep. 1, 2014  (KR) .................. 10-2014-0115256

(51) Int. Cl.
*H01L 21/67* (2006.01)
*H01L 21/673* (2006.01)
(Continued)

(52) U.S. Cl.
CPC ........ *H01L 21/67393* (2013.01); *H01L 21/02* (2013.01); *H01L 21/302* (2013.01);
(Continued)

(58) Field of Classification Search
CPC ......... H01L 21/67393; H01L 21/67775; H01L 21/67017; H01L 21/67772; H01L 21/302; H01L 21/02
See application file for complete search history.

(56) References Cited

U.S. PATENT DOCUMENTS

| 6,135,168 A | 10/2000 | Yang et al. |
| 2006/0177289 A1 | 8/2006 | Bonora et al. |

FOREIGN PATENT DOCUMENTS

| JP | 11-301849 | 11/1999 |
| JP | 2002-531934 | 9/2002 |

(Continued)

OTHER PUBLICATIONS

International Search Report for International Application No. PCT/KR2015/008796, dated Dec. 9, 2015.
(Continued)

*Primary Examiner* — Jason K Niesz
(74) *Attorney, Agent, or Firm* — Kile Park Reed & Houtteman PLLC

(57) ABSTRACT

A purge module which can provide a conventional load port without a gas purging function with the gas purging function, and a load port having the purge module are disclosed. The purge module comprises a jig, a gas control box and pipes. The jig is detachably attached to an upper side of a stage of a load port. The jig comprises a gas inlet for providing a wafer carrier with gas and a gas outlet for receiving gas from the wafer carrier. The gas control box is detachably attached to the load port to control gas flow. The pipes connect the jig and the gas control box.

12 Claims, 7 Drawing Sheets

(51) Int. Cl.
*H01L 21/302* (2006.01)
*H01L 21/02* (2006.01)
*H01L 21/677* (2006.01)

(52) U.S. Cl.
CPC .. *H01L 21/67017* (2013.01); *H01L 21/67772* (2013.01); *H01L 21/67775* (2013.01)

(56) References Cited

FOREIGN PATENT DOCUMENTS

| | | |
|---|---|---|
| JP | 2006-351619 | 12/2006 |
| JP | 2007-221042 | 8/2007 |
| JP | 2007-227800 | 9/2007 |
| JP | 2009-212282 | 9/2009 |
| JP | 2010-40912 | 2/2010 |
| JP | 2013-153188 | 8/2013 |
| KR | 10-2003-0011536 | 2/2003 |
| KR | 10-2005-0045695 | 5/2005 |
| KR | 10-2011-0101083 | 9/2011 |
| TW | 414946 | 12/2000 |
| TW | 527681 | 4/2003 |
| TW | M310201 | 4/2007 |
| TW | M441929 | 11/2012 |
| TW | 201320218 | 5/2013 |
| TW | M456581 | 7/2013 |
| WO | 00/32472 | 6/2000 |
| WO | 2014/030421 | 2/2014 |

OTHER PUBLICATIONS

English translation of the Written Opinion of International Application No. PCT/KR2015/008796, dated Mar. 7, 2017.

PURGE MODULE AND LOAD PORT HAVING THE SAME

TECHNICAL FIELD

The present invention relate to a purge module and a load port having the purge module. More particularly, the present invention relate to a purge module purging dust in a wafer carrier in which a plurality of semiconductor wafers are packed, by using gas and a load port having the purge module.

BACKGROUND ART

Generally, a plurality of materials is formed on a wafer in a thin film shape and the patterned to form a semiconductor device. That is, a deposition process, an etching process, a cleaning process, a drying process, etc. are required to form a semiconductor device.

In order to perform the above process, a wafer transferring apparatus is used for transferring wafers. In this case, a load port is widely used to provide the wafer transferring apparatus such as EFEM with wafers carried by a wafer carrier.

On the other hand, when foreign substance such as dust exists in the wafer carrier, the foreign substance may induce failure of the wafer. Therefore, the foreign substance is removed by gas purging. An initial model of a load port does not have the gas purging function, but a new model of a load port has a nitrogen (N2) purging function purging foreign substance by using nitrogen gas to solve above problem.

However, it is too expensive to substitute all of the conventional load port without a gas purging function with the new load port with the gas purging function.

Furthermore, there are so many kind of wafer carrier. Therefore, when the wafer carrier is changed, a new load port that is proper to the new wafer carrier is required.

DISCLOSURE

Technical Problem

Therefore, the technical problem of the present invention is to provide a purge module which is applicable to the conventional load port without the gas purge function to provide the conventional load port with the gas purging function, and is adaptable to various kind of wafer carrier.

Further, the technical problem of the present invention to provide a load port on which the purge module is installed.

Technical Solution

An exemplary embodiment of the present invention discloses a purge module comprising a jig, a gas control box and pipes. The jig is detachably attached to an upper side of a stage of a load port. The jig comprises a gas inlet for providing a wafer carrier with gas and a gas outlet for receiving gas from the wafer carrier. The gas control box is detachably attached to the load port to control gas flow. The pipes connect the jig and the gas control box.

An exemplary embodiment of the present invention also discloses a load port comprising a base plate, a stage, a jig, a gas control box and pipes. The stage protrudes from the base plate. The jig is detachably attached to an upper side of the stage. The jig comprises a gas inlet for providing a wafer carrier with gas and a gas outlet for receiving gas from the wafer carrier. The gas control box is detachably attached to the load port to control gas flow. The pipes connect the jig and the gas control box.

For example, the gas control box may be detachable attached under the stage of the load port.

For example, the jig may further comprise a suction port fastening the wafer carrier by sucking the wafer carrier.

For example, the suction port may be disposed at the rear portion of the wafer carrier.

For example, at least one of the gas inlet and the gas outlet may comprise a sealing member making contact with the wafer carrier, when the wafer carrier is disposed thereon, the sealing member including an elastic material, a sealing protection member disposed surrounding the sealing member, and an elastic member supporting the lower portion of the sealing protection member.

In this case, the sealing protection member may be higher than the sealing member with respect to a surface of the jig.

For example, the jig may have a plate shape. The jig may have a connection member for connection with the pipes, and gas passages may be formed inside of the jig.

Advantageous Effects

When the purge module according to the present invention is installed on the conventional load port without purge function, the conventional load port can be equipped with the purge function. Therefore, it is not required to replace the convention load port without the purge function with the new load port with the purge function. Further, in order to be applied various kind of wafer carrier, it is sufficient to replace only the jig.

When the gas control box is detachably attached under the stage of the load port, the space under the stage can be used so that no additional space is required and attaching the gas control box can be easy.

When the jig includes a suction port making contact with a wafer carrier for suctioning the wafer carrier for fastening, the wafer carrier may be fastened effectively even when the nitrogen gas is injected instantaneously.

When the suction port is disposed at the rear portion of the wafer carrier, the function of the suction port can be maximized.

When the sealing protection member is formed, the sealing member that is gradually abraded can be protected to increase the replacement period of the sealing member.

When the sealing protection member is higher than the sealing member, and the sealing protection member is lowered by the elastic supporter such that the sealing member makes contact with a wafer carrier, abrasion of the sealing member is further reduced to further increase replacement period of the sealing member.

When the gas passages are formed in the jig with a plate shape, no additional structure for the gas passage is required to prevent increasing the thickness of the jig, so that the jig can stably support a wafer carrier.

MODE FOR INVENTION

Figure 1:
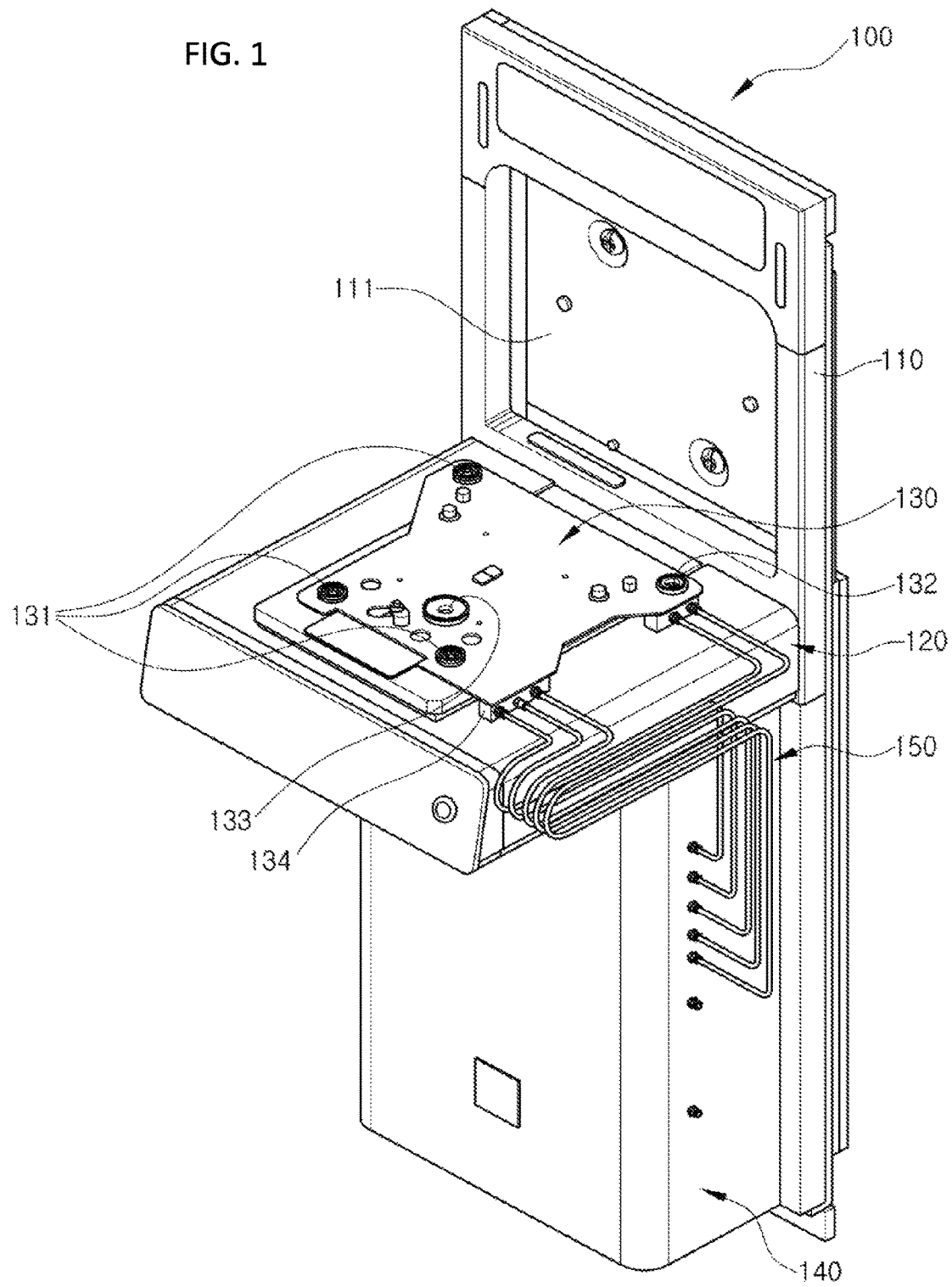
FIG. 1 is a perspective view showing a load port according to an exemplary embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that, although the terms first, second, third etc. may be used herein to describe various elements, components, regions, layers and/or sections, these elements, components, and/or sections should not be limited by these terms. These terms are only used to distinguish one element, component, region, layer or section from another region, layer or section. Thus, a first element, component, or section discussed below could be termed a second element, component, or section without departing from the teachings of the present invention.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, the meaning that A is connected with B includes not only the meaning that the A is directly connected with the B, but also the meaning that another member C is interposed between the A and the B.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

For convenience, same numerals are used for identical or similar elements of an apparatus of cutting a tempered substrate and the conventional one.

Hereinafter, exemplary embodiments of the present invention will be described with reference to the accompanying drawings.

Figure 2:
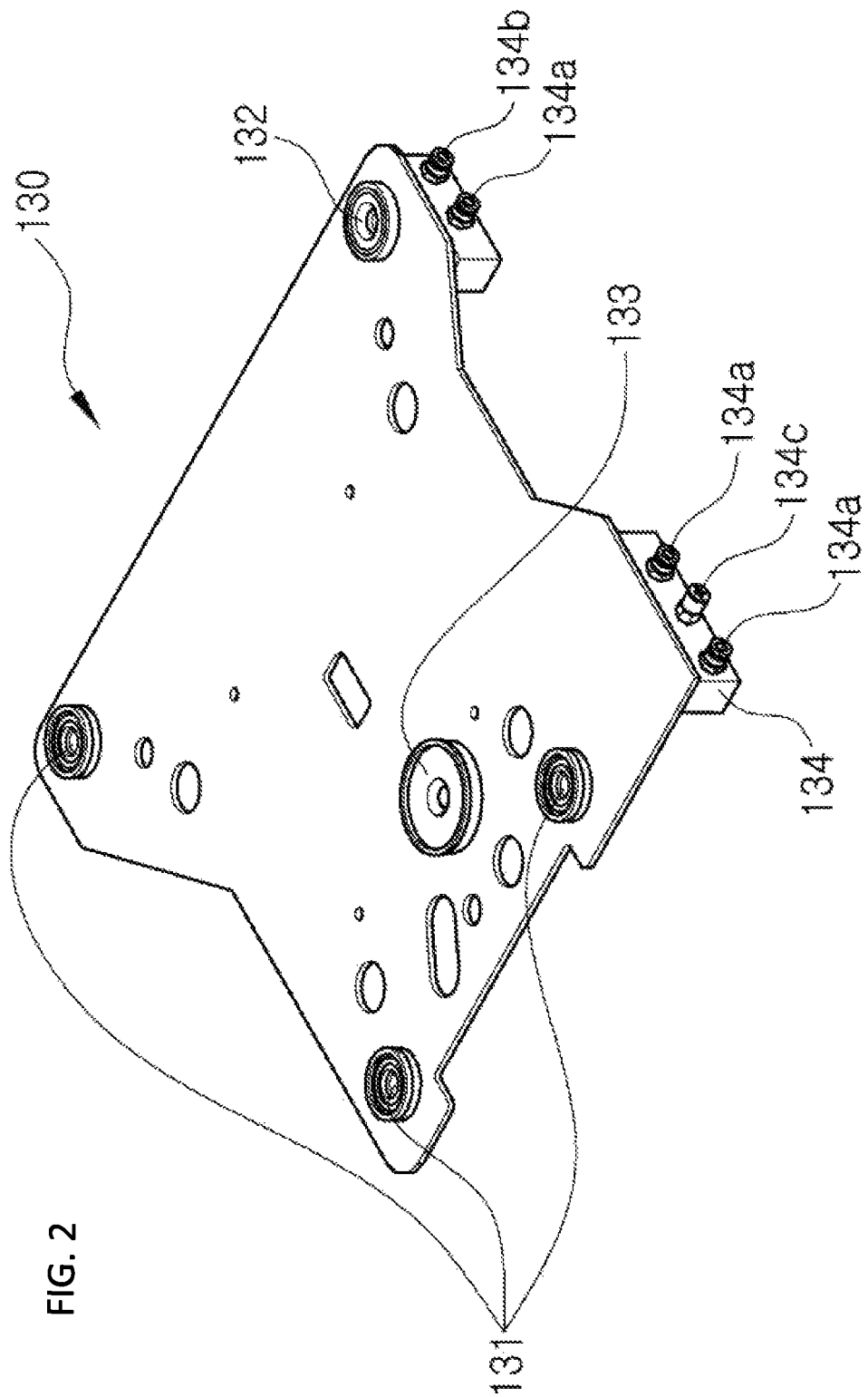
FIG. 2 is a perspective view showing a jig installed on the load port in FIG. 1.

FIG. 1 is a perspective view showing a load port according to an exemplary embodiment of the present invention, and FIG. 2 is a perspective view showing a jig installed on the load port in FIG. 1.

Referring to FIG. 1 and FIG. 2, a load port 100 according to an exemplary embodiment of the present invention includes a base plate 110, a stage 120, a jig 130, a gas control box 140 and a plurality of pipes 150.

The base plate 110 has, for example, a rectangular plate shape that is erected. The base plate 110 may be connected to a wafer transferring apparatus (EFEM). The base plate 110 has an open and shut part 111 through which wafers in the wafer carrier (not shown) is transferred. The wafer carrier means all kind of box for carrier wafers such as a foup, a fosb, a cassette, an open cassette, etc.

The stage 120 horizontally protrudes from the base plate 110. The stage 120 supports a wafer carrier (not shown) in which wafers are packed.

The jig 130 is detachably connected to the stage 120. The jig 130 has a plate shape, and includes a gas inlet 131 for injecting gas into the wafer carrier and a gas outlet 132 for receiving gas from the wafer carrier. In this case, the jig 130 is formed such that the shape of the jig 130 and the size and the position of the gas inlet 131 and the gas outlet 132 correspond to a specific wafer carrier.

At least one of the gas inlet 131 and the gas outlet 132 may include a sealing member formed by an elastic material, a sealing protection member and an elastic supporter. Regarding to FIGS. 3, 4 and 5, the above structure will be explained in detail.

The jig 130 may further include a suction port 133. The suction port 133 makes contact with a wafer carrier for suctioning the wafer carrier for fastening. In removing foreign substances by injecting gas (for example nitrogen gas) into the wafer carrier, the wafer carrier may be floated, when the gas of 0.5 MPa is instantaneously injected. In order to prevent the above problem, the suction port 133 sucks the wafer carrier for fastening the wafer carrier. When the suction port 133 sucks the wafer carrier by a vacuum in a range of −60 KPa to −80 KPa, the wafer carrier may be fastened effectively.

The suction port 133 may be disposed at the rear portion of the wafer carrier. When the suction port 133 is disposed at the rear portion of the wafer carrier, the suction portion 133 is disposed more close to the gas inlet 131 than the gas outlet 132 so that a function of the suction port 133 may be maximized.

A connection member 134 is attached to a lower surface of the jig 130. For example, the connection member 134 may be disposed at one side of the jig 130. The pipes 150 are connected to the connection member 134. The connection member 134 includes a gas inlet port 134a, a gas outlet port 134b and a suction port 134c. The gas inlet port 134a is connected to the gas inlet 131 through a gas passage (not shown) formed in the jig 130, the gas outlet port 134b is connected to the gas outlet 132 through a gas passage (not shown) formed in the jig 130, and the suction port 134c is connected to the suction port 133 through a gas passage (not shown) formed in the jig 130. The gas passage is described referring to FIG. 6.

Figure 6:
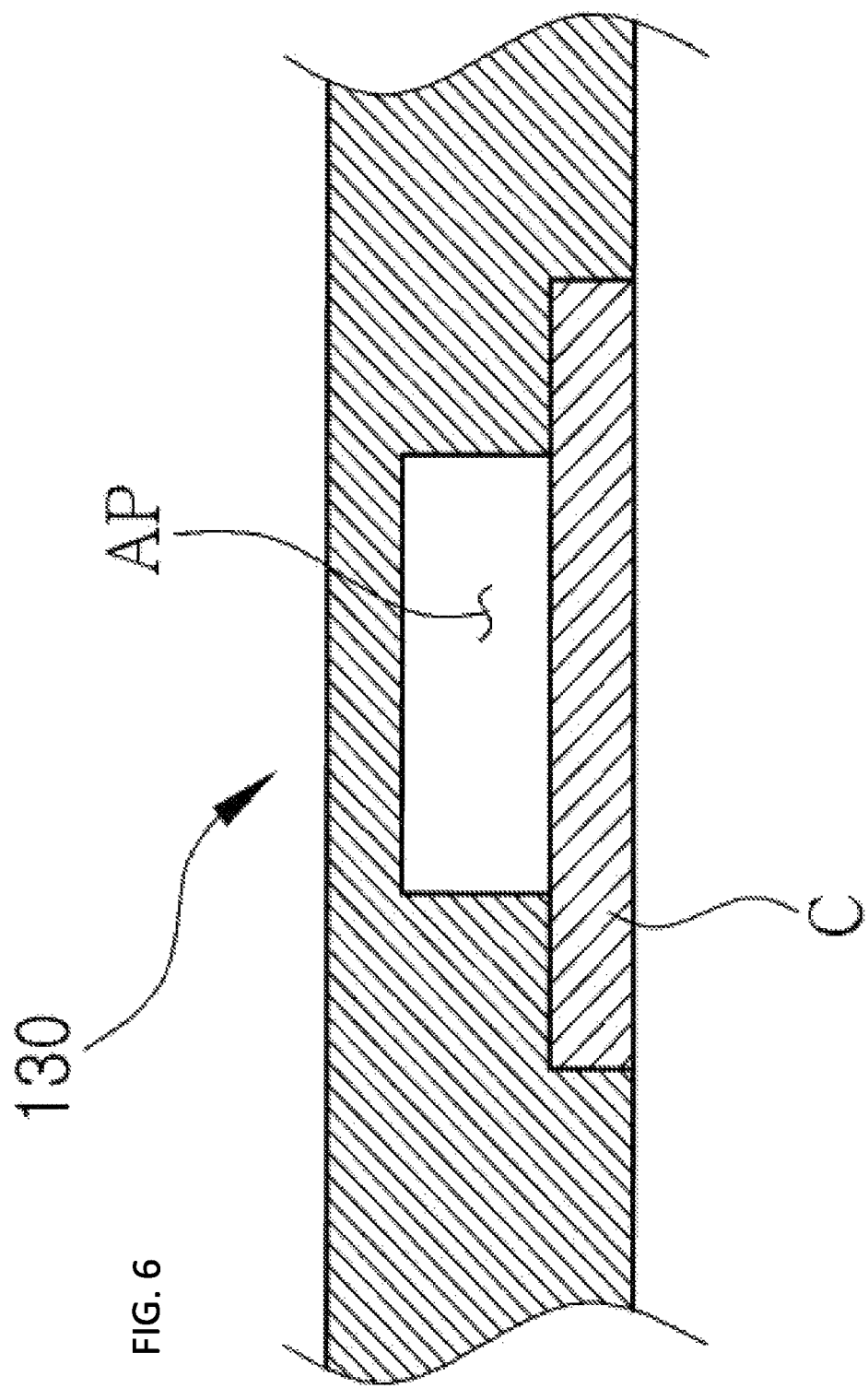
FIG. 6 is a cross-sectional view showing a gas passage formed in the jig in FIG. 2.

FIG. 6 is a cross-sectional view showing a gas passage formed in the jig in FIG. 2.

Referring to FIG. 6, the gas passage AP is formed in the jig 130 with a plate shape, and gas flows along the gas passage AP. In order to form the gas passage AP in the jig 130 with a plate shape, grooves connecting the connection member 134 with the gas inlet 131 and the gas outlet 132 are formed, for example, on a lower surface of the jig 130. In this case, the grooves has ⌐-shaped cross-section, and the grooves are sealed by a cover C that is a thin plate to form the gas passage AP.

As described above, when the gas passages AP are formed in the jig 130 with a plate shape, no additional structure for the gas passage is required to prevent increasing the thickness of the jig 130, so that the jig 130 can stably support a wafer carrier.

Referring again to FIG. 1 and FIG. 2, the gas control box 140 is detachably attached to the base plate 110 to control flow of the gas. In detail, the gas control box 140 may be detachably attached under the stage 120 of the load port. In this case, the space under the stage 120 can be used so that no additional space is required and attaching the gas control box 140 can be easy.

The pipes 150 connect the jig 130 with the gas control box 140. In detail, the pipes 150 is formed from a side of the gas control box 140 to the connection member 134 attached to the jig 130 to connect the jig 130 with the gas control box 140.

Hereinafter, the gas control box 140 is explained referring to FIG. 7.

Figure 7:
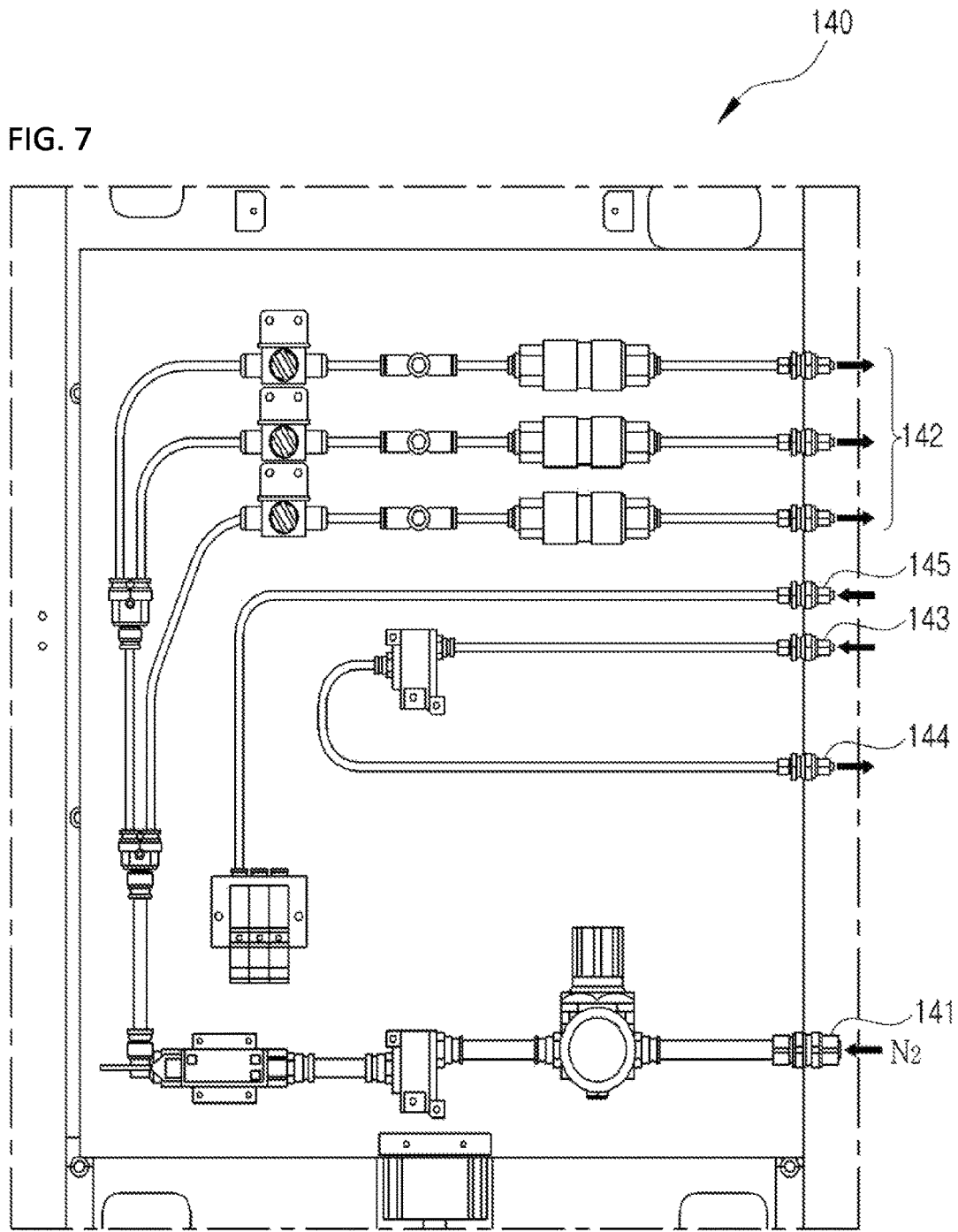
FIG. 7 is a front view showing inside of a gas control box installed on the load port in FIG. 1 after opening a cover of the gas control box.

FIG. 7 is a front view showing inside of a gas control box installed on the load port in FIG. 1 after opening a cover of the gas control box.

Referring to FIG. 1, FIG. 2 and FIG. 7, nitrogen gas provided through a gas supply port 141 is discharged out of the gas control box 140 through a gas injection port 142, and provided to a wafer carrier through the pipes 150, the gas inlet port 134a of the connection member 134 and gas inlet 131. The gas provided to the wafer carrier is provided again to the gas control box 140 through the gas outlet 132, the gas outlet port 134b of the connection member 134, the pipes 150, a discharge gas inlet port 143 of the gas control box 140, and discharged out of the gas control box 140 through a discharge gas outlet port 144 of the gas control box 140.

Additionally, the gas in the inhale port 145 of the gas control box 140, the pipes 150, the suction portion 134c of the connection member 134, and the suction port 133 is inhaled so that the wafer carrier making contact with the suction port 133 is fastened.

Figure 3:
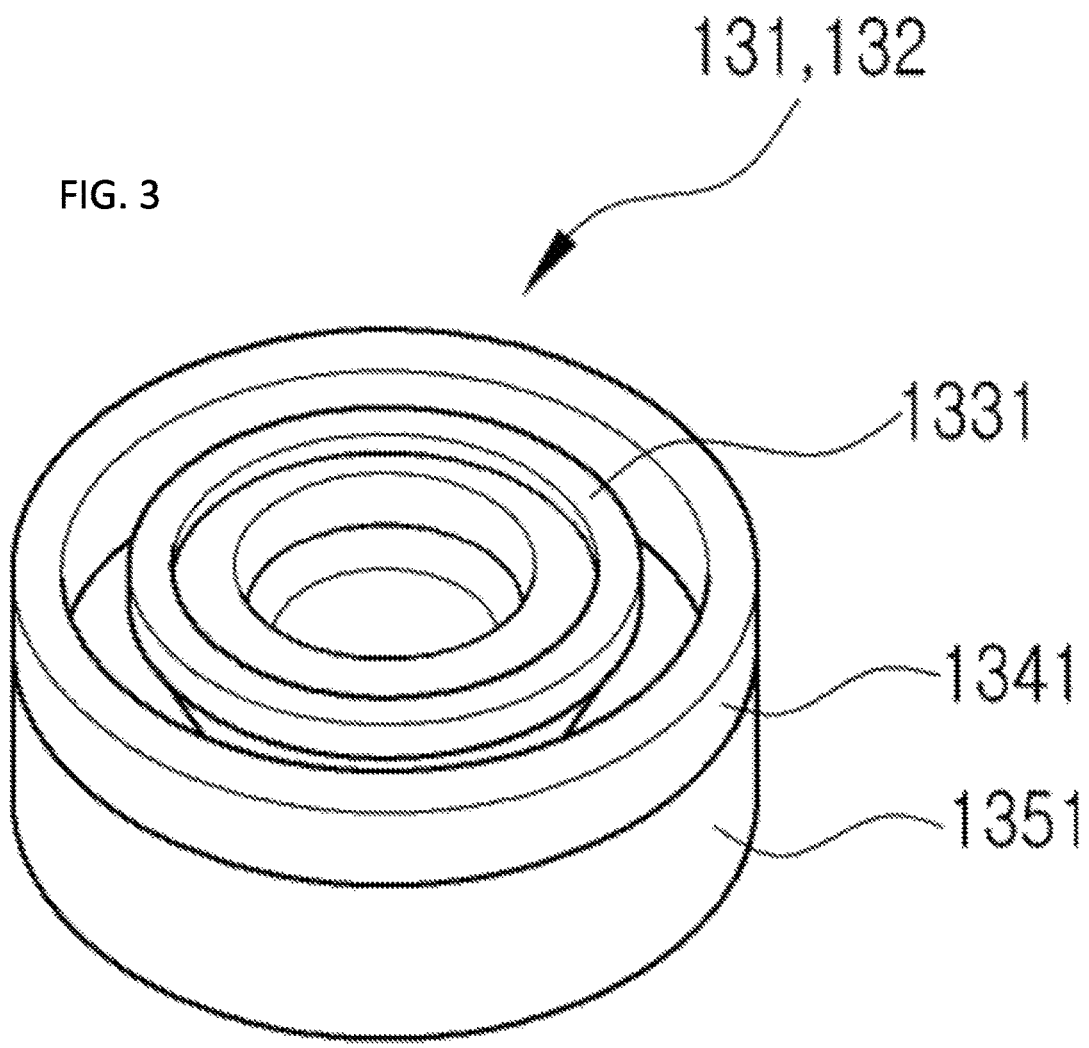
FIG. 3 is a perspective view showing a gas inlet or a gas outlet of the jig in FIG. 2.
Figure 4:
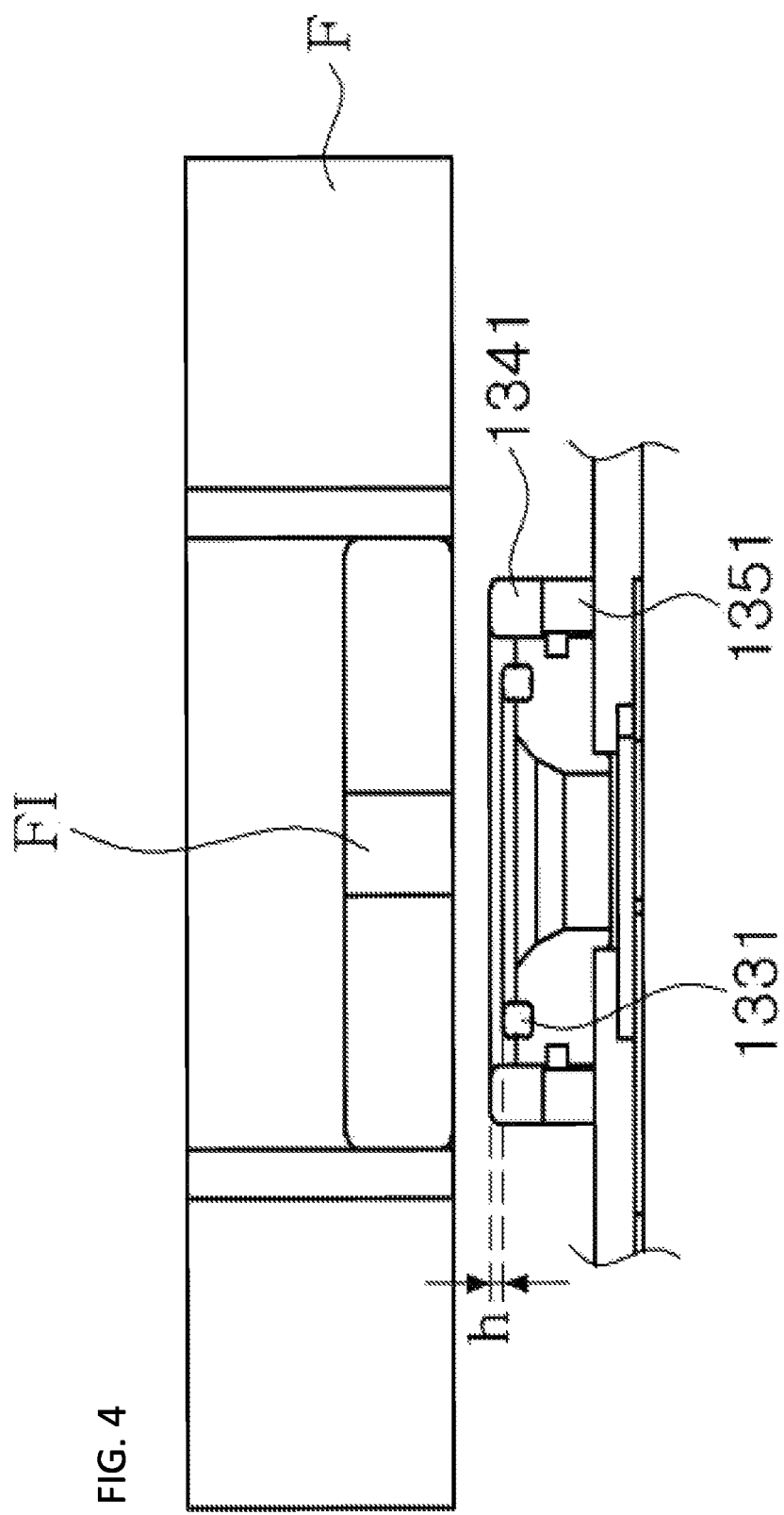
FIG. 4 is a cross-sectional view showing the gas inlet or the gas outlet of the jig before making contact with a wafer carrier.

FIG. 3 is a perspective view showing a gas inlet or a gas outlet of the jig in FIG. 2. FIG. 4 is a cross-sectional view showing the gas inlet or the gas outlet of the jig before making contact with a wafer carrier, and FIG. 5 is a cross-sectional view showing the gas inlet or the gas outlet of the jig after making contact with a wafer carrier.

Figure 5:
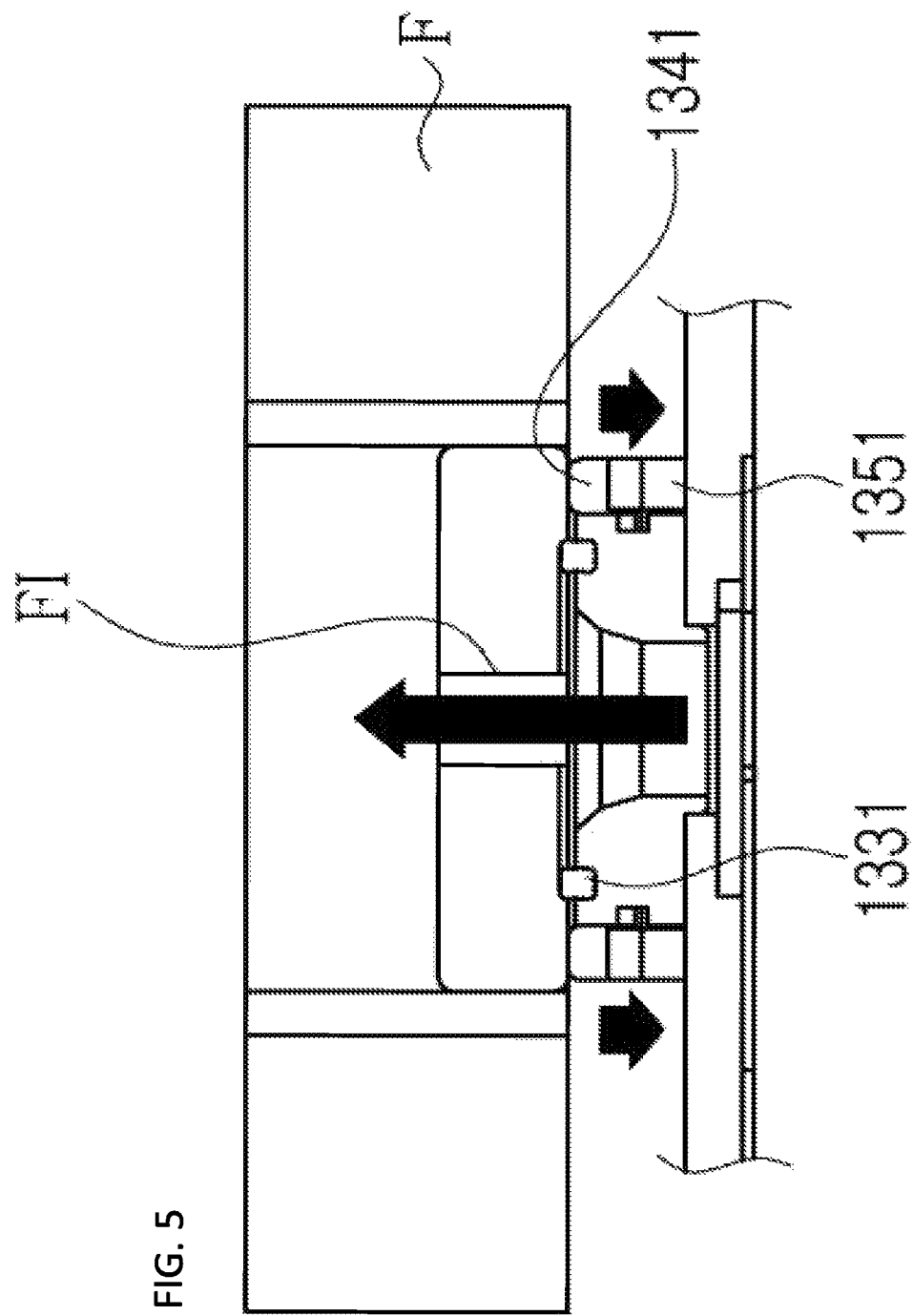
FIG. 5 is a cross-sectional view showing the gas inlet or the gas outlet of the jig after making contact with a wafer carrier.

Referring to FIG. 3, FIG. 4 and FIG. 5, at least one of the gas inlet 131 and the gas outlet 132 may include a sealing member 1331 formed by an elastic material, a sealing protection member 1341 and an elastic supporter 1351.

The sealing member 1331 makes contact with a wafer carrier, when the wafer carrier is disposed thereon. The sealing member 1331 may be formed with a material with high elasticity, for example such as a silicone rubber. The sealing member 1331 improves a contact force to the wafer carrier to prevent gas leakage.

The sealing protection member 1341 is disposed outside of the sealing member 1331 to surround the sealing member 1331. The sealing protection member 1341 and the sealing member 1331 may be concentrically disposed. The sealing protection member 1341 may be formed with a material that is harder than the sealing member 1331. For example, the sealing protection member 1341 may be formed with a plastic. The sealing protection member 1341 is supported by the elastic supporter 1351.

As shown in FIG. 4, the sealing protection member 1341 is higher than the sealing member 1331 by height h to protect the sealing member 1331, when a wafer carrier F is not disposed thereon.

As shown in FIG. 5, the sealing protection member 1341 is lowered by the elastic supporter 1351 due to the weight of the wafer carrier F, when the wafer carrier F is disposed thereon so that the sealing member 1331 makes contact with the wafer carrier F. In this case, the gas inlet and gas outlet makes tight contact with the gas holes of the wafer carrier F.

As described above, when the sealing protection member 1341 is higher than the sealing member 1331, and the sealing protection member 1341 is lowered by the elastic supporter 1351 such that the sealing member 1331 makes contact with the wafer carrier F, abrasion of the sealing member 1331 is reduced to increase replacement period of the sealing member 1331.

The load port 100 described above is substantially same as the conventional load port except for the purge module including the jig 130, the gas control box 140 and the pipes 150. When the purge module according to the present invention is installed on the conventional load port without purge function, the conventional load port can be equipped with the purge function. Therefore, it is not required to replace the convention load port without the purge function with the new load port with the purge function. Further, in order to be applied various kind of wafer carrier, it is sufficient to replace only the jig 130.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

The invention claimed is:

1. A purge module comprising:
    a jig detachably attached to an upper side of a stage of a load port, the jig comprising a gas inlet for providing a wafer carrier with gas and a gas outlet for receiving gas from the wafer carrier;
    a gas control box detachably attached to the load port to control gas flow; and
    pipes connecting the jig and the gas control box,
    wherein at least one of the gas inlet and the gas outlet further comprises a sealing member making contact with the wafer carrier, when the wafer carrier is disposed thereon, the sealing member including an elastic material;
    a sealing protection member disposed surrounding the sealing member; and
    wherein the sealing protection member is higher than the sealing member with respect to a surface of the jig.

2. The purge module of claim 1, wherein the gas control box is detachable attached under the stage of the load port.

3. The purge module of claim 1, wherein the jig further comprises a suction port fastening the wafer carrier by sucking the wafer carrier.

4. The purge module of claim 3, wherein the suction port is disposed at the rear portion of the wafer carrier.

5. The purge module of claim 1, wherein at least one of the gas inlet and the gas outlet further comprises:
    an elastic member supporting the lower portion of the sealing protection member.

6. The purge module of claim 1, wherein the jig has a plate shape, and has a connection member for connection with the pipes, and gas passages are formed inside of the jig.

7. A load port comprising:
a base plate;
a stage protruding from the base plate;
a jig detachably attached to an upper side of the stage, the jig comprising a gas inlet for providing a wafer carrier with gas and a gas outlet for receiving gas from the wafer carrier;
a gas control box detachably attached to the load port to control gas flow; and
pipes connecting the jig and the gas control box,
wherein at least one of the gas inlet and the gas outlet further comprises a scaling member making contact with the wafer carrier, when the wafer carrier is disposed thereon, the sealing member including an elastic material;
a sealing protection member disposed surrounding the sealing member; and
wherein the sealing protection member is higher than the sealing member with respect to a surface of the jig.

8. The load port of claim 7, wherein the gas control box is detachable attached under the stage of the load port.

9. The load port of claim 7, wherein the jig further comprises a suction port fastening the wafer carrier by sucking the wafer carrier.

10. The load port of claim 9, wherein the suction port is disposed at the rear portion of the wafer carrier.

11. The load port of claim 7, wherein at least one of the gas inlet and the gas outlet further comprises:
an elastic member supporting the lower portion of the sealing protection member.

12. The load port of claim 7, wherein the jig has a plate shape, and has a connection member for connection with the pipes, and gas passages are formed inside of the jig.

* * * * *